United States Patent
Ito

(10) Patent No.: US 8,049,204 B2
(45) Date of Patent: Nov. 1, 2011

(54) SEMICONDUCTOR MEMORY DEVICE HAVING VARIABLE RESISTANCE ELEMENT AND METHOD FOR MANUFACTURING THE SAME

(75) Inventor: Kimihiko Ito, Tokyo (JP)

(73) Assignee: NEC Corporation, Tokyo (JP)

( * ) Notice: Subject to any disclaimer, the term of this patent is extended or adjusted under 35 U.S.C. 154(b) by 101 days.

(21) Appl. No.: 12/527,681

(22) PCT Filed: Feb. 18, 2008

(86) PCT No.: PCT/JP2008/052614
§ 371 (c)(1), (2), (4) Date: Aug. 18, 2009

(87) PCT Pub. No.: WO2008/102718
PCT Pub. Date: Aug. 28, 2008

(65) Prior Publication Data
US 2010/0078615 A1    Apr. 1, 2010

(30) Foreign Application Priority Data
Feb. 19, 2007   (JP) .................................. 2007-037897

(51) Int. Cl.
*H01L 43/00*    (2006.01)
(52) U.S. Cl. .................... 257/14; 257/E45.003; 365/148
(58) Field of Classification Search ............... 257/2, 14, 257/E27.004, E45.003; 365/148
See application file for complete search history.

(56) References Cited

U.S. PATENT DOCUMENTS

| 3,905,006 A * | 9/1975 | Matsuoka et al. | 338/21 |
| 2009/0102598 A1 * | 4/2009 | Yamazaki et al. | 338/20 |

FOREIGN PATENT DOCUMENTS

| JP | 2005166976 A | 6/2005 |
| JP | 2006080259 A | 3/2006 |
| JP | 2006135335 A | 5/2006 |
| JP | 2006261677 A | 9/2006 |
| JP | 2007027537 A | 2/2007 |
| JP | 2007036256 A | 2/2007 |
| WO | WO 2007010746 A1 * | 1/2007 |
| WO | 2007102483 A | 9/2007 |
| WO | 2007105284 A | 9/2007 |

OTHER PUBLICATIONS

J. F. Gibbons et al., "Switching Properties of Thin NiO Films", Solid-State Electronics Pergamon Press 1964, vol. 7, p. 785-797, 1964.

* cited by examiner

*Primary Examiner* — Thomas L Dickey

(57) ABSTRACT

A semiconductor memory device includes a variable resistance element including a first electrode, a current path forming region, and a second electrode. The current path forming region includes a first region made of a variable resistance material whose resistivity changes by applying voltage, and a second region formed by doping a metal element to the variable resistance material such that a resistivity of the second region is higher than that of the first region and is not changed by applying a voltage used to change the resistivity of the first region. The first region is in contact with the first electrode and the second electrode, and extends from one electrode side to the other electrode side. The second region is provided outside the first region in at least part of the current path forming region in direction extending from one electrode side to the other electrode side.

16 Claims, 7 Drawing Sheets

(a)  (b)

SEMICONDUCTOR MEMORY DEVICE HAVING VARIABLE RESISTANCE ELEMENT AND METHOD FOR MANUFACTURING THE SAME

This application is the National Phase of PCT/JP2008/052614, filed Feb. 18, 2008, which is based upon and claims the benefit of priority from the Japanese Patent Application No. 2007-37897 filed on Feb. 19, 2007, the disclosure of which is incorporated herein in its entirety by reference.

TECHNICAL FIELD

The present invention relates to a semiconductor memory device, and more particularly, to a structure of a variable resistance non-volatile memory element and a method of manufacturing the same.

BACKGROUND ART

The non-volatile memory such as a flash memory and a SONOS memory, which has currently become the mainstream of the market, uses such a technique as electric charges accumulated in an insulating film provided above a channel portion cause threshold voltage of a semiconductor transistor to be changed. Microfabrication is required to provide larger capacity, but even a simple semiconductor transistor having no charge accumulation function has become difficult to microfabricate. With that in mind, a functional division has been considered such that the transistor serves only as a switching function of selecting a memory cell for reading and writing information and the information storage element is separated from the transistor like a DRAM; and each of the transistor and the information storage element undergoes microfabrication separately to provide larger capacity.

As a technique for implementing microfabrication of the information storage element, there has been actively developed a variable resistance element which is an electronic element allowing a value of the electrical resistance to be changed between two or more values by an electrical impulse. In an information storage device accumulating electrical charges in a capacitor, such as a DRAM, signal voltage is lowered with a reduction in the amount of accumulated electrical charges due to microfabrication. But, the variable resistance element is advantageous for microfabrication in that electrical resistance generally holds a finite value with microfabrication, provided that there are a principle of changing resistance and a material having the principle.

The operation of such a variable resistance element serves as a switch switching between the ON state and the OFF state. In principle, the variable resistance element can be applied to, for example, a switch (selector) in a wiring configuration in an LSI.

There have been several techniques for changing electrical resistance by an electrical impulse. The most studied techniques of them include a memory device using a fact that when a pulse current is applied to a chalcogenide semiconductor, the crystal phase states (amorphous state and crystalline state) are changed; the states differ from each other in electrical resistance by 2 or 3 orders of magnitude. Such a memory device is generally called a phase change memory.

On another front, regarding a metal/metal oxide/metal (hereinafter referred to as an MIM type) structure where electrodes sandwich a metal oxide, there has been known that the resistance of the structure can be changed by applying a large voltage or current. In the 1950s to 1960s, there have been studies on various materials exhibiting the phenomenon that resistance varies due to voltage or current. For example, a variable resistance element using nickel oxide (NiO) has been reported in Non-Patent Document 1 (Solid-State Electronics, 1964, vol. 7, pp. 785-797). In general, the phase change memory not only involves a large change in volume with a change in crystal phase but also needs to be heated locally to several 100° C. in a short time of several 10 nsec to change the crystal phase. On the other hand, the MIM type variable resistance element has recently been gaining attention again since the need to heat to a high temperature of several 100° C. has not been reported.

FIG. 1 shows a schematic sectional view for explaining a basic structure of an MIM type variable resistance element; and FIG. 2 shows a current voltage characteristic of the MIM type variable resistance element using a variable resistance material made of a nickel oxide.

The MIM type variable resistance element illustrated in FIG. 1 includes first upper electrode 1, second lower electrode 3, and variable resistance material 2 made of a metal oxide provided therebetween. This variable resistance element can non-volatilely maintain the characteristic of a high resistance OFF state or a low resistance ON state even when the power is turned off. Further, the resistance states thereof can be switched by applying a predetermined voltage/current impulse as needed. When voltage Vt1 or higher is applied to the element in a high resistance OFF state illustrated in FIG. 2(a), the state of the element is changed to a low resistance ON state illustrated in FIG. 2(b). Afterward, when voltage Vt2 or higher is applied to the element in the ON state illustrated in FIG. 2(b), the state of the element is changed to the high resistance OFF state, returning to the electrical characteristic of FIG. 2(a). The MIM type variable resistance element can repeat a switching operation between the state of FIG. 2(a) and the state of FIG. 2(b). This characteristic can be used as a non-volatile memory cell or a non-volatile switch for switching circuits.

Such an MIM type variable resistance element uses a transition metal oxide as a main variable resistance material, and the metal oxide material generally has a high resistivity. It is hence easy for the MIM type variable resistance element to maintain the high resistance state (OFF state as the switch), and therefore it is important to control the transitional process to the low resistance state (ON state as the switch).

The current path for maintaining the low resistance state of the MIM type variable resistance element is not formed over the entire electrode surface, but is formed locally to be approximately several nm, at most several 10 nm in diameter. This current path is schematically illustrated in FIG. 3. In FIG. 3, tubular path 4 connecting first upper electrode 1 and second lower electrode 3 is formed in variable resistance material 2.

FIG. 4 illustrates an electrode area dependence of a resistance in a low resistance state of a parallel plate element configured such that NiO is used as the variable resistance material in the same manner as described in Non-Patent Document 1 described above and the material is sandwiched between the electrodes. FIG. 4 indicates that the resistance in the low resistance state practically does not depend on the electrode area, and clearly demonstrates that the low resistance state is maintained by the locally formed current path.

FIG. 5 is an equivalent circuit diagram in the ON state. RON denotes a resistance corresponding to current path 4 in the ON state. ROFF denotes a state in which current path 4 is not formed, namely, an OFF state resistance. In general, ROFF/RON can be considered to be maintained at about $10^2$ or more.

DISCLOSURE OF THE INVENTION

As described above, in order to implement the MIM type variable resistance element, it is important to suppress the generation of an unnecessary low resistance current path, and to improve the controllability of formation and blocking of current path 4 in the ON state. However, the related art faces difficulty to provide a uniform threshold voltage necessary for changing resistance for each element. Therefore, the related art has a problem in that no current path can be formed, or the element often cannot be put in the ON state; even if a current path is formed, the element often cannot be disconnected again (OFF) after the formation thereof; and in some cases, the resistance switching operation cannot be made, and production yield is low. Moreover, the operating element often exhibits variations in characteristics such as the voltage and current necessary for changing the electrical resistance for each element as well as the resistance in the ON state and the resistance in the OFF state.

FIG. 6 is a schematic view illustrating the MIM type variable resistance element in the ON state for explaining the cause of the above problems.

As illustrated in FIG. 6, if the MIM type element has an electrode area larger than that of the current path, not only current path 4 but also other current paths 5 are generated in parallel.

As illustrated in FIG. 7, the related MIM type variable resistance element is surrounded by wires 7 connected to the electrodes thereof and insulating film 8 made of $SiO_2$, a low-dielectric insulator and the like. The variable resistance material hence has damage such as a crystal defect in processes of forming an electrode and processing a variable resistance material itself, or in other processes related to the processes; alternatively, due to the contacting material, a part of the variable resistance material is reduced so that metal separates out, or an interface reaction may generate a conductive material; consequently, unnecessary current path 6 is formed.

FIG. 8 illustrates an equivalent circuit diagram for the case where unnecessary current paths 5 and 6 are present (the ON state illustrated in FIG. 6). The resistance of current paths 5, RON', occurring in the element, and the resistance of current path 6, $R_{LEAK}$, due to the process of manufacturing the variable resistance element are connected in parallel to RON which is necessary for the switch element. Desired current path 4 is formed by building up charge carriers such as electrons on the path. If RON≧RON' or RON≧$R_{LEAK}$, current mainly flows to current path 5 corresponding to RON' or current path 6 corresponding to $R_{LEAK}$. In other words, the energy (electrical field and charge carrier) necessary for switching resistances do not build up on desired current path 4, and thus desired resistance switch does not occur.

As described above, a major cause of the incapability of switching operation is that, due to damage such as a lattice defect introduced in the middle of the manufacturing process, a current path having a low and unchangeable resistance tends to be formed around the element.

In view of the above, an object of the present invention is to provide a semiconductor memory device in which variation of element characteristics is suppressed by preventing unnecessary current paths from being formed.

The present invention provides a semiconductor memory element and a method of manufacturing the same as follows.
(1) A semiconductor memory device including a variable resistance element including a first electrode, a current path forming region provided in contact with the first electrode, and a second electrode provided in contact with the current path forming region, wherein the current path forming region includes
a first region made of a variable resistance material whose resistivity changes by applying voltage, the material containing a first metal element, and
a second region formed by doping a second metal element to the variable resistance material such that a resistivity of the second region is higher than that of the first region and is not changed by applying a voltage used to change the resistivity of the first region;
the first region is in contact with the first electrode and the second electrode, and extends from one electrode side to the other electrode side such that a current path is formed therebetween; and
the second region is provided outside the first region in at least part of the current path forming region in direction extending from one electrode side to the other electrode side.
(2) A semiconductor memory device including a variable resistance element including a first electrode, a current path forming region provided in contact with the first electrode, and a second electrode provided in contact with the current path forming region, wherein the semiconductor memory device includes a laminated structure including the first electrode, the current path forming region, and the second electrode;
the current path forming region includes
a first region made of a variable resistance material whose resistivity changes by applying voltage, the material containing a first metal element, and
a second region formed by doping a second metal element to the variable resistance material such that a resistivity of the second region is higher than that of the first region and is not changed by applying a voltage used to change the resistivity of the first region;
the first region is in contact with the first electrode and the second electrode, and extends from one electrode side to the other electrode side such that a current path is formed therebetween; and
the second region is in contact with an periphery portion of at least one of the first electrode and the second electrode, and is provided on an outer circumference of the first region at least on the second region-contacting-electrode side.
(3) The semiconductor memory device according to the above item (2), wherein the second region is in contact with the periphery portion of the first electrode and periphery portion of the second electrode, and is provided on the outer circumference of the first region over from one electrode side to the other electrode side.
(4) The semiconductor memory device according to any one of the above items (1) to (3), wherein the variable resistance material is an oxide of the first metal element.
(5) The semiconductor memory device according to the above item (4), wherein the variable resistance material is an oxide of at least one kind of metal element selected from the group consisting of Ni, Ti, Zr, Hf, Fe, V, Mn, and Co.
(6) The semiconductor memory device according to any one of the above items (1) to (5), wherein the second metal element is at least one kind of metal element selected from the group consisting of Mn, Fe, Ta, Al, Si, Ge, Ti and Nb.
(7) The semiconductor memory device according to any one of the above items (1) to (3), wherein the variable resistance material is an oxide of Ni, and the second metal element is Mn.

(8) The semiconductor memory device according to any one of the above items (1) to (7), further including a transistor electrically connected to one electrode of the variable resistance element.

(9) The semiconductor memory device according to the above item (8), wherein the transistor includes a source region, a drain region, a gate insulating film, and a gate electrode; and one electrode of the variable resistance element is electrically connected to the source region or the drain region.

(10) The semiconductor memory device according to the above item (9), wherein one electrode of the variable resistance element is electrically connected to the source region or the drain region via a barrier layer.

(11) The semiconductor memory device according to the above item (9) or (10), wherein the variable resistance element is provided above the transistor via an interlayer insulating film; and one electrode of the variable resistance element is connected to a conductive material extracted from the source region or the drain region through the interlayer insulating film.

(12) A method of manufacturing the semiconductor memory device as recited in the above item (2) or (3), the method including:

forming a first electrode;

forming a variable resistance material layer including a first metal element on the first electrode;

forming a mask on the variable resistance material layer;

forming a second metal containing layer including a second metal element on the entire surface so as to cover the mask;

conducting heat treatment such that the second metal element is doped and diffused from the second metal containing layer to the variable resistance material layer to form a first region without the second metal element being doped and a second region with the second metal element being doped;

removing the mask; and forming a second electrode so as to cover a portion where the first region is exposed by removing the mask.

(13) A method of manufacturing the semiconductor memory device as recited in the above item (3), the method including:

forming a first electrode material layer;

forming a variable resistance material layer including a first metal element on the first electrode material layer;

forming a second electrode material layer on the variable resistance material layer;

patterning the first electrode material layer, the variable resistance material layer and the second electrode material layer to form a laminated structure including a first electrode, a variable resistance material layer and a second electrode;

forming a second metal containing layer including a second metal element on the entire surface so as to cover the laminated structure; and conducting heat treatment such that the second metal element is doped and diffused from the second metal containing layer to the variable resistance material layer to form a first region without the second metal element being doped and a second region with the second metal element being doped.

The present invention can provide a semiconductor memory device in which variation of element characteristics is suppressed.

BEST MODE FOR CARRYING OUT THE INVENTION

A variable resistance element in accordance with an exemplary embodiment of the present invention includes a first electrode, a current path forming region in contact with the first electrode, and a second electrode in contact with the current path forming region. The variable resistance element has a structure capable of forming a current path in the current path forming region. This structure can spatially limit the portion for forming the current path. As a result, an unnecessary current path can be prevented from being generated.

This current path forming region is formed by using, as the base material, a variable resistance material whose resistance changes by applying voltage. The current path forming region includes a compensation element doping region where an element compensating a charge carrier (hereinafter referred to as "compensation element") is doped to the base material, and a variable resistance region formed from the base material where a compensation element is not doped to the base material. The compensation element doping region has a higher resistivity than the variable resistance region. The resistance of the compensation element doping region does not change by applying a voltage capable of changing the resistance of the variable resistance region. No current path is formed in the compensation element doping region, and a current path is formed only in the variable resistance region. Therefore, the compensation element doping region serves to limit the region where the current path is formed (variable resistance region), and thus can prevent an unnecessary current path from being formed. For example, a compensation element doping region can be provided at the periphery of the element such as an electrode end susceptible to damage such as a lattice defect, and thus the current path can be locally formed in the middle of the electrode.

The variable resistance region (where a compensation element is not doped) is extended from one electrode side to the other electrode side in the current path forming region such that a current path can be formed between the electrodes. The compensation element doping region can be formed outside the variable resistance region such that the variable resistance region is left at least near the center portion. At this time, the configuration may be such that the compensation element doping region is formed on both sides of the variable resistance region, which is sandwiched therebetween, or such that the compensation element doping region is formed so as to surround the variable resistance region. Of the above two configurations, the latter configuration is preferable in that an unnecessary current path can be more effectively suppressed from being formed. Here, the outside of the variable resistance region corresponds to the outer circumference of the axis along the current path direction from one electrode side to the other electrode side.

Figure 10:
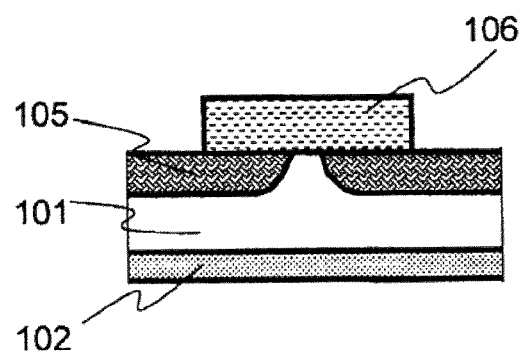
FIG. 10 is a schematic sectional view illustrating an element structure in accordance with an exemplary embodiment of the present invention.
Figure 12:
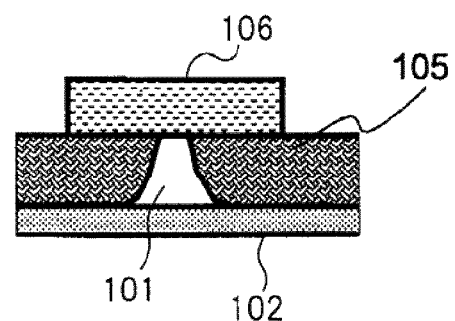
FIG. 12 is a schematic sectional view illustrating an element structure in accordance with another exemplary embodiment of the present invention.
Figure 13:
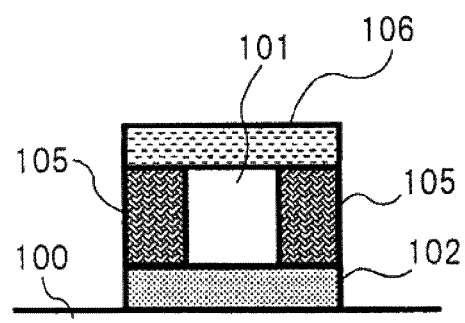
FIG. 13 is a schematic sectional view illustrating an element structure in accordance with another exemplary embodiment of the present invention.

The compensation element doping region need only be formed in at least part of the current path forming region extending from one electrode side to the other electrode side, as illustrated in FIG. 10 described later, but the probability of forming an unnecessary current path can be further reduced by forming the compensation element doping region in the current path forming region such that the compensation element doping region continuously extends from one electrode side to the other electrode side. For example, as illustrated in FIGS. 12 and 13 described later, by limiting the variable resistance region so as to extend from under the center portion of the upper electrode to immediately above the center portion of the lower electrode, an unnecessary current path can be further effectively suppressed from being formed, and also a current path due to the manufacturing process can be prevented from being formed.

According to the configuration of the present invention, the compensation element doping region provided outside or around the variable resistance region uses the same variable resistance material as that inside the region as the base material. Therefore, the interface between the regions is chemically stable and no composition change occurs by a natural oxidation-reduction reaction, thereby providing a highly durable structure.

According to the configuration of the present invention, the compensation element doping region provided outside or around the variable resistance region has a very high electrical resistance and does not change resistance in the range of the switch operating voltage applied to the variable resistance material of the inner region. Therefore, no current path is formed. The present invention is based on a technique which not only can change the electrical resistance by changing the chemical composition of the variable resistance material, but also can suppress the resistance change phenomenon, or can control the switch threshold voltage.

Figure 1:
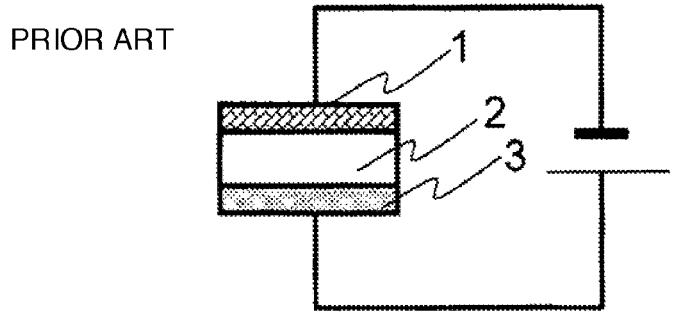
FIG. 1 is a schematic sectional view for explaining a basic structure of an MIM type variable resistance element.
Figure 2:
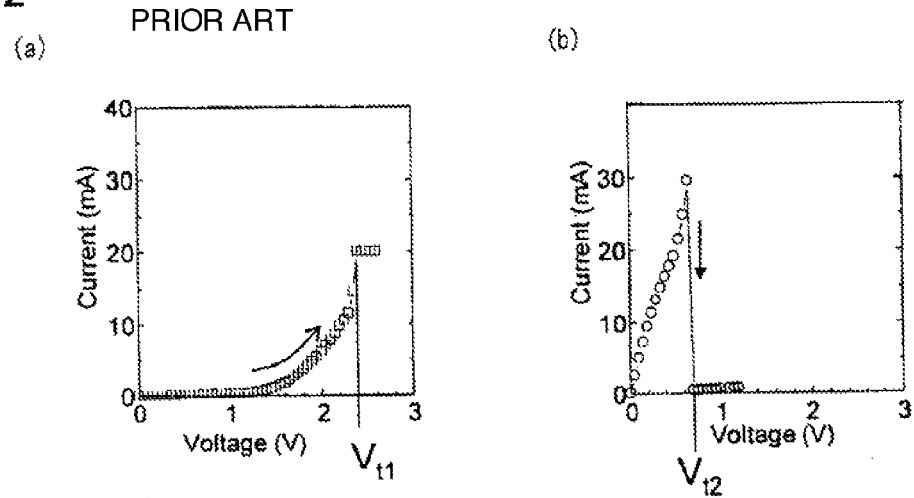
FIG. 2 is a drawing showing a change in current voltage characteristic of the MIM type variable resistance element using a variable resistance material made of an Ni oxide.
Figure 3:
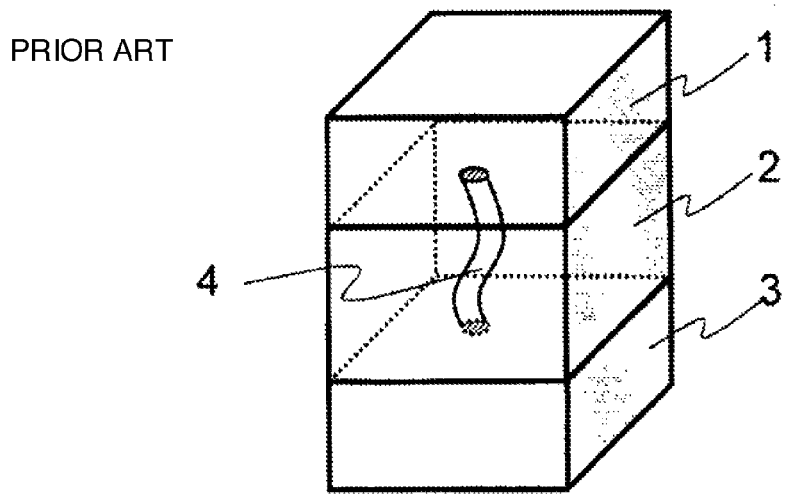
FIG. 3 is a schematic view (downward perspective view) illustrating a local current path for maintaining an ON state in the MIM type variable resistance element.
Figure 4:
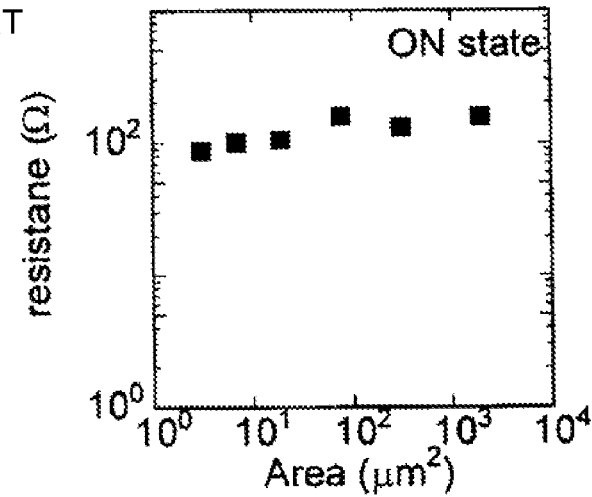
FIG. 4 is a drawing illustrating an electrode area dependence of a resistance of a parallel plate MIM type variable resistance element in the ON state.
Figure 5:
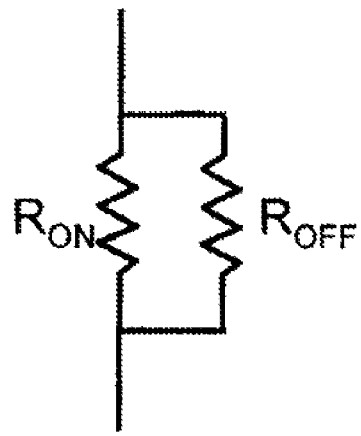
FIG. 5 is an equivalent circuit diagram of the MIM type variable resistance element in the ON state illustrated in FIG. 3.
Figure 6:
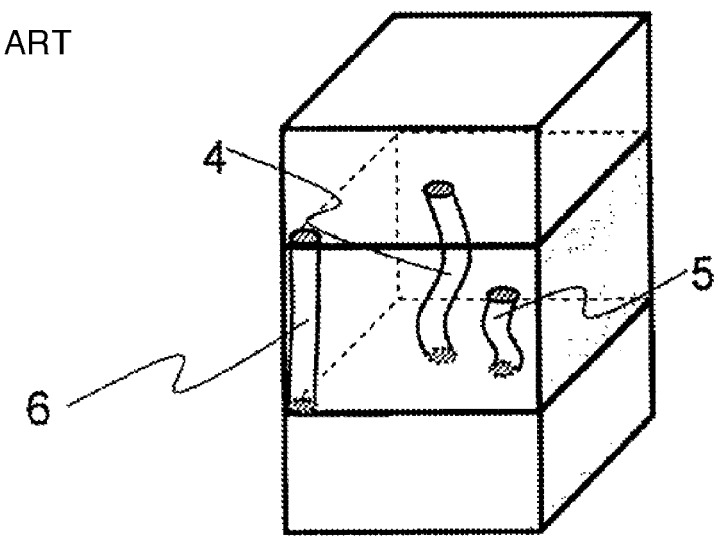
FIG. 6 is a schematic view (downward perspective view) illustrating the MIM type variable resistance element in the ON state for explaining the cause of a problem of the related art.
Figure 7:
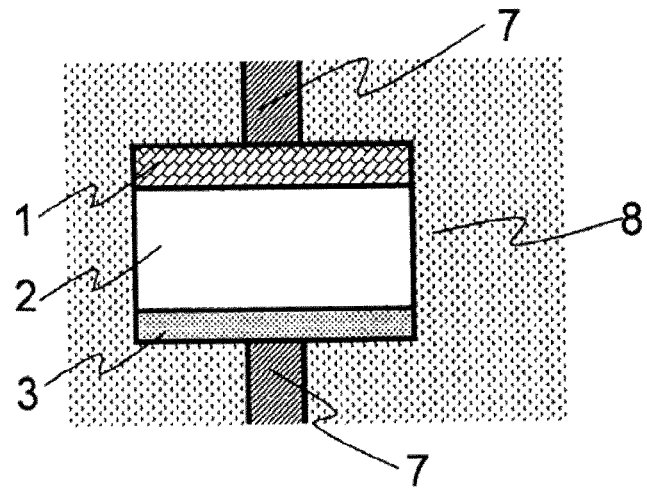
FIG. 7 is a schematic sectional view of a parallel plate MIM type variable resistance element of the related art.
Figure 8:
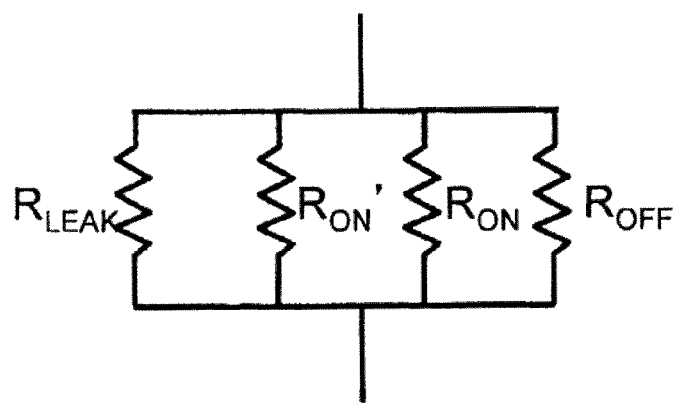
FIG. 8 is an equivalent circuit diagram of the MIM type variable resistance element in the ON state illustrated in FIG. 6.
Figure 9:
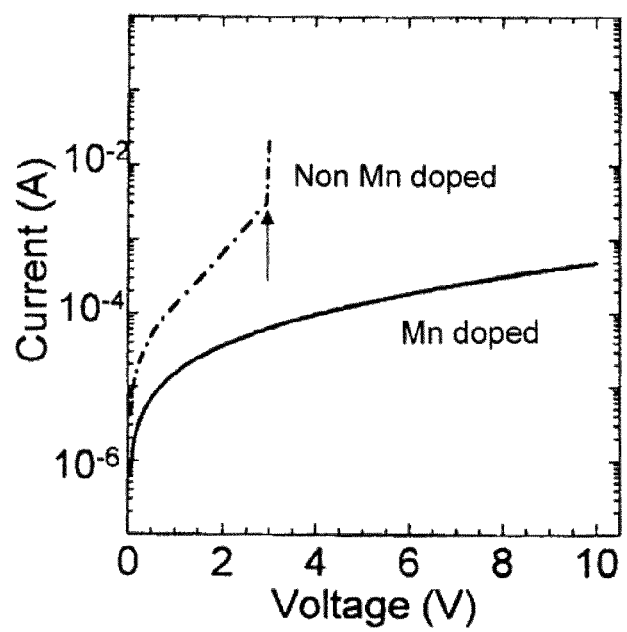
FIG. 9 is a drawing showing a current voltage characteristic of a variable resistance element in accordance with an exemplary embodiment of the present invention.

This technique is described by referring to an experimental result using NiO as the variable resistance material. FIG. 9 shows current voltage characteristics of variable resistance elements using NiO in the OFF state. It is understood that when only NiO is used (see the one-dot chain line: non Mn doped in FIG. 9), the variable resistance element is in a low resistance and is switched to the ON state at a voltage (about 3 V) indicated by the arrow. In contrast, it is confirmed that when Mn is doped into NiO by thermal diffusion (see the solid line in FIG. 9), the electrical resistance in the OFF state increases 10 or more times and the variable resistance element is not switched to the ON state even by applying three or more times the voltage of the switch voltage. The reason for the effect is probably that a positive hole (charge carrier) caused by an Ni deficit is compensated by doping Mn, or the moving degree of the positive hole is reduced by a change in crystal structure.

As the compensation element in the present invention, there can be used an element which can compensate a charge carrier of the variable resistance material of the base material or an element which can reduce the moving degree of the charge carrier by inducing the change of the crystal structure. As the compensation element, an element with its stable valence different from that of the metal element included in the variable resistance material of the base material is preferable. The examples thereof include Mn, Fe, Ta, Al, Si, Ge, Ti, and Nb, two or more of which may be used in combination.

A metal oxide is preferable as the variable resistance material in the present invention. The examples of the metal element of the metal oxide include Ni, Ti, Zr, Hf, Fe, V, Mn, Co, two or more of which may be used in combination.

Hereinafter, exemplary embodiments will be described with reference to the accompanying drawings.

First Exemplary Embodiment

FIG. 10 is a schematic sectional view illustrating an element structure in accordance with an exemplary embodiment. Reference numeral 102 denotes a first electrode (lower electrode), reference numeral 106 denotes a second electrode (upper electrode), reference numeral 101 denotes a variable resistance region, and reference numeral 105 denotes a compensation element doping region where a compensation element is doped to a variable resistance material.

The variable resistance element in accordance with the present exemplary embodiment has a laminated structure including lower electrode 102, a current path forming region, and upper electrode 106; the current path forming region has variable resistance region 101 and compensation element doping region 105, and is made of the variable resistance material as its base material. In this laminated structure, lower electrode 102 and upper electrode 106 are arranged facing each other; and variable resistance region 101 is arranged so as to be in contact with these electrodes and to extend from one electrode side to the other electrode side. Compensation element doping region 105 is arranged so as to surround variable resistance region 101 on upper electrode 106 side.

Hence, in this element structure, the contact area between variable resistance region 101 and upper electrode 106 is smaller than the contact area between upper electrode 106 and current path forming region (variable resistance region 101 and compensation element doping region 105), and is smaller than the contact area between lower electrode 102 and current path forming region (variable resistance region 101). Moreover, the cross-sectional area of variable resistance region 101 along the plane perpendicular to the current path direction (here, in a direction perpendicular to the substrate surface) extending from one electrode side to the other electrode side is reduced at the upper electrode side.

A method of manufacturing such an element structure will be described with reference to FIGS. 11*a* to 11*e*.

Figure 11A:
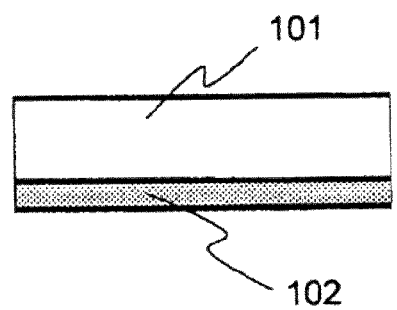
FIG. 11a is a schematic view illustrating a manufacturing process of the element structure in accordance with an exemplary embodiment of the present invention.

First, as illustrated in FIG. 11*a*, variable resistance material layer 101 is formed on lower electrode 102.

Figure 11B:
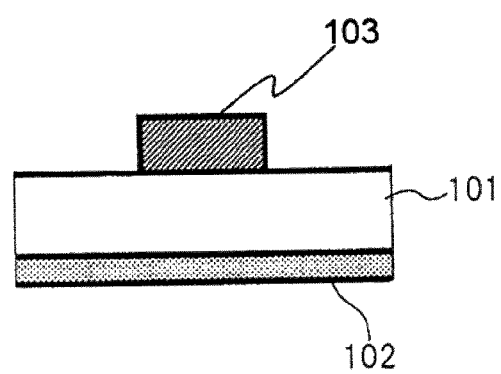
FIG. 11b is a schematic view illustrating the manufacturing process of the element structure in accordance with an exemplary embodiment of the present invention.

Next, as illustrated in FIG. 11*b*, SiO$_2$ mask 103 is formed on variable resistance material layer 101. Mask 103 can be formed by a general patterning method using an insulator such as SiO$_2$, an organic matter such as a resist material, or a metal.

Figure 11C:
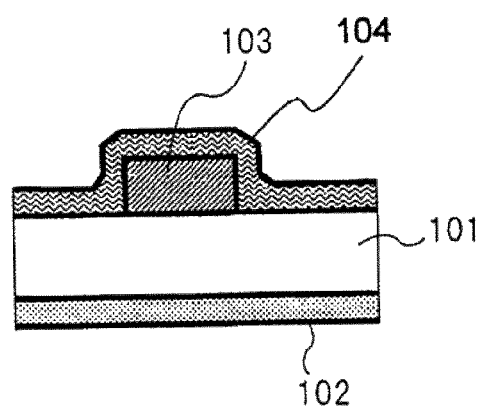
FIG. 11c is a schematic view illustrating the manufacturing process of the element structure in accordance with an exemplary embodiment of the present invention.

Afterward, as illustrated in FIG. 11*c*, compensation element containing film 104 is formed to a thickness of several nm to several 100 nm on the entire surface thereof. When variable resistance material layer 101 is made of NiO, compensation element 104 is preferably Mn. As such a compensation element, instead of Mn, a metal element which can be stable trivalent or higher ion in a sold matter such as Ti, Ta, Nb, Al, and Fe, can be used. Alternatively, the compensation element may be a compound of these metal elements or may be an alloy containing these metal elements.

Figure 11D:
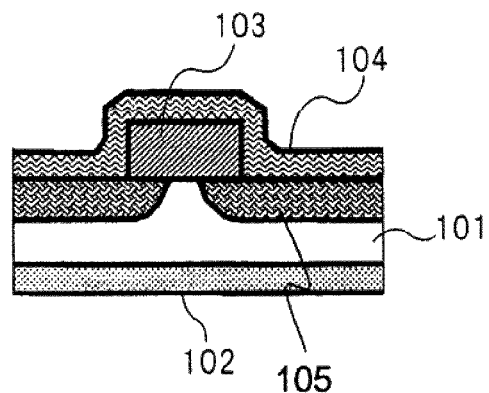
FIG. 11d is a schematic view illustrating the manufacturing process of the element structure in accordance with an exemplary embodiment of the present invention.

After compensation element containing film 104 is formed, as illustrated in FIG. 11*d*, the compensation element is diffused in variable resistance material layer 101 by heat treatment to form compensation element doping region 105. At this time, thermal diffusion causes the compensation element to be diffused at the bottom of mask 103. As illustrated in FIG. 9 described above, compensation element doping region 105 has a higher resistance than the region (variable resistance region 101) to which no compensation element is doped and does not cause a resistance change phenomenon. The heat treatment conditions can be set according to the material and the desired structure. For example, the temperature can be set in the range of 300 to 500° C., and the heat treatment time can be set in the range of 1 second to 10 hours.

Figure 11E:
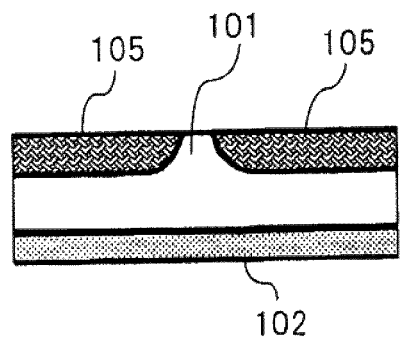
FIG. 11e is a schematic view illustrating the manufacturing process of the element structure in accordance with an exemplary embodiment of the present invention.

Afterward, as illustrated in FIG. 11*e*, mask 103 and surplus compensation element containing film 104 are removed. This removal process can be performed by a general removal method such as wet etching and dry etching depending on the mask material, the compensation element containing film and the variable resistance material.

Finally, upper electrode 106 is formed by a general method so as to cover the exposed portion of variable resistance region 101, resulting that the element structure illustrated in FIG. 10 described above can be formed.

Second Exemplary Embodiment

FIG. 12 is a schematic sectional view illustrating an element structure in accordance with the second exemplary embodiment. The difference from the first exemplary embodiment is that compensation element doping region 105 is formed to extend from one electrode side to the other electrode side and is in contact with both the electrodes. More specifically, variable resistance region 101 is provided to extend from the center portion under upper electrode 106 to the center portion above lower electrode 102. This structure can reduce the probability of forming an unnecessary current path in comparison with the first exemplary embodiment.

A method of manufacturing the element structure of the present exemplary embodiment is the same as that of the first exemplary embodiment illustrated in FIG. 11*d* except that compensation element doping region 105 is formed to reach lower electrode 102 side from upper electrode 106 side. In the process of doping the compensation element, compensation element doping region 105 can be formed by setting the heat treatment conditions, as needed, according to the kind of variable resistance material and compensation element, the thickness of variable resistance material layer, and the like.

Third Exemplary Embodiment

FIG. 13 is a schematic sectional view illustrating an element structure in accordance with the third exemplary embodiment.

According to the present exemplary embodiment, as illustrated in FIG. 13, variable resistance region 101 is provided to extend from the center portion under upper electrode 106 to the center portion above lower electrode 102; and compensation element doping region 105 is formed so as to surround the outer circumference of variable resistance region 101, extends from one electrode side to the other electrode side, and is in contact with both the electrodes. This structure can reduce the probability of forming an unnecessary current path in comparison with the first exemplary embodiment.

The difference in manufacturing from the first exemplary embodiment and the second exemplary embodiment is that upper electrode 106, lower electrode 102, and variable resistance region 101 are formed by being processed by a method such as dry etching.

A method of manufacturing the structure of the present exemplary embodiment will be described with reference to FIGS. 14*a* to 14*c*.

First, a conductive layer for the lower electrode, a variable resistance material layer, and a conductive layer for the upper electrode are formed on substrate 100 in that order.

Figure 14A:
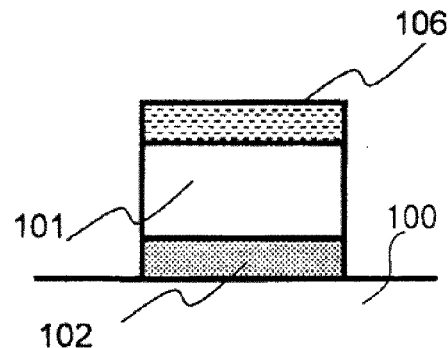
FIG. 14a is a schematic view illustrating a manufacturing process of the element structure in accordance with another exemplary embodiment of the present invention.

Then, a general photolithography and a dry etching technique are used to process this structure to form a laminated structure including lower electrode 102, variable resistance material layer 101 and upper electrode 106 illustrated in FIG. 14*a*. In this state, the exposed side surface of variable resistance material layer 101 has damage caused by the manufacturing process of dry etching and the like. Therefore, the use of this laminated structure as the variable resistance element increases the probability of forming a low resistance current path near the side surface where variable resistance material layer 101 is exposed.

Figure 14B:
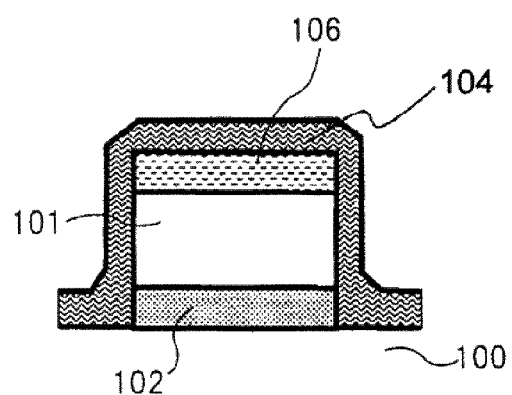
FIG. 14b is a schematic view illustrating the manufacturing process of the element structure in accordance with another exemplary embodiment of the present invention.

Afterward, as illustrated in FIG. 14*b*, compensation element containing film 104 is formed so as to cover the above laminated structure.

Figure 14C:
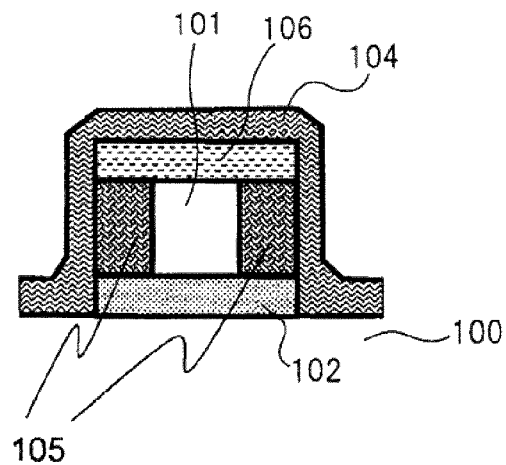
FIG. 14c is a schematic view illustrating the manufacturing process of the element structure in accordance with another exemplary embodiment of the present invention.

Then, as illustrated in FIG. 14c, heat treatment is performed such that a compensation element is doped from a side surface of variable resistance material layer 101 and is thermally diffused to form compensation element doping region 105. At this time, so as to leave a non-doped region (variable resistance region 101) extending from the center portion under upper electrode 106 to the center portion above lower electrode 102, the heat treatment conditions are set as needed according to the kind of variable resistance material and compensation element, the thickness of variable resistance material layer, and the like.

Finally, surplus compensation element containing film 104 can be removed by wet etching or the like to obtain the element structure illustrated in FIG. 13 described above. According to this element structure, the region near the side surface to which the compensation element is doped has a large electrical resistance and does not cause a resistance switch. As a result, the formation of a current path near the side surface can be prevented. Moreover, in the same manner as in the second exemplary embodiment, compensation element doping region 105 is formed around variable resistance region 101 and extends from one electrode side to the other electrode side, which can reduce the probability of forming an unnecessary current path in comparison with the first exemplary embodiment. Further, the compensation element doping region can be formed so as to include a damage region near the side surface, which can prevent the formation of a current path caused by the damage region, thereby improving yield.

Other Exemplary Embodiment

The element structure according to the present invention is not limited to the above exemplary embodiment including the laminate type structure of sequentially laminated layers in a direction perpendicular to the substrate, but may be an exemplary embodiment having any structure as long as the cross-sectional area of variable resistance region along the plane perpendicular to the current path direction extending from one electrode side to the other electrode side is smaller than the contact area between the current path forming region and one electrode and is further smaller than the contact area between the current path forming region and the other electrode. The current path forming region along the current path direction has a portion of narrow variable resistance region, which can limit the formation of a current path, and thus can suppress the generation of an unnecessary current path. Moreover, this structure preferably has a compensation metal doping region outside the variable resistance region so as to be in contact with a periphery portion of at least one of the electrodes, and more preferably has a compensation metal doping region so as to be in contact with a periphery portion of both the electrodes and to continuously extend from one electrode side to the other electrode side. This structure can more effectively prevent an unnecessary current path from occurring.

Figure 15:
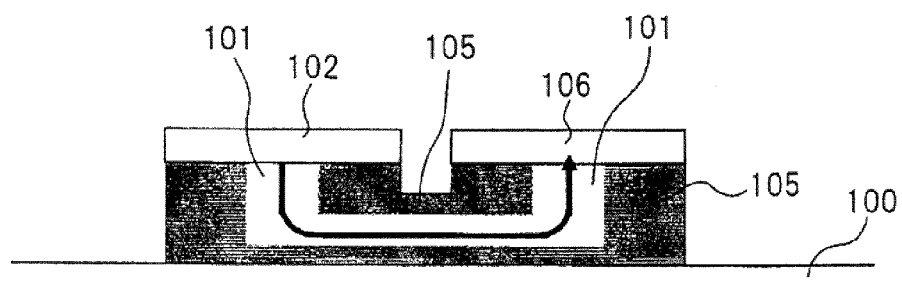
FIG. 15 is a schematic sectional view illustrating an element structure in accordance with another exemplary embodiment of the present invention.
Figure 16:
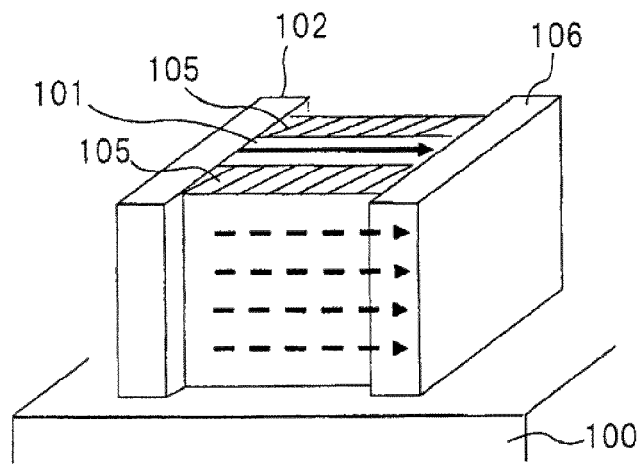
FIG. 16 is a schematic sectional view illustrating an element structure in accordance with another exemplary embodiment of the present invention.

For example, the exemplary structures are illustrated in FIGS. 15 and 16.

In the element structure illustrated in FIG. 15, a current path forming region made of a variable resistance material as its base material is provided on substrate 100, and first electrode 102 and second electrode 106 electrically separated with each other are provided thereon. Inside the current path forming region, variable resistance region 101 is sandwiched between compensation element doping regions 105 over from one electrode side to the other electrode side. In this structure, the current path direction is perpendicular to the substrate near the individual electrode and is parallel to the substrate surface near the middle between the electrodes. This structure can limit the formation of the current path within variable resistance region 101, and can prevent an unnecessary current path from occurring.

The element structure illustrated in FIG. 16 has a laminated structure including first electrode 102, a current path forming region (variable resistance region 101 and compensation element doping region 105), and second electrode 106, which are laminated in a direction parallel to the substrate surface on substrate 100. Inside the current path forming region, variable resistance region 101 is sandwiched between compensation element doping regions 105 over from one electrode side to the other electrode side. In this structure, the current path direction is parallel to the substrate surface. This structure can limit the formation of a current path within variable resistance region 101, and can prevent an unnecessary current path from occurring.

Figure 17:
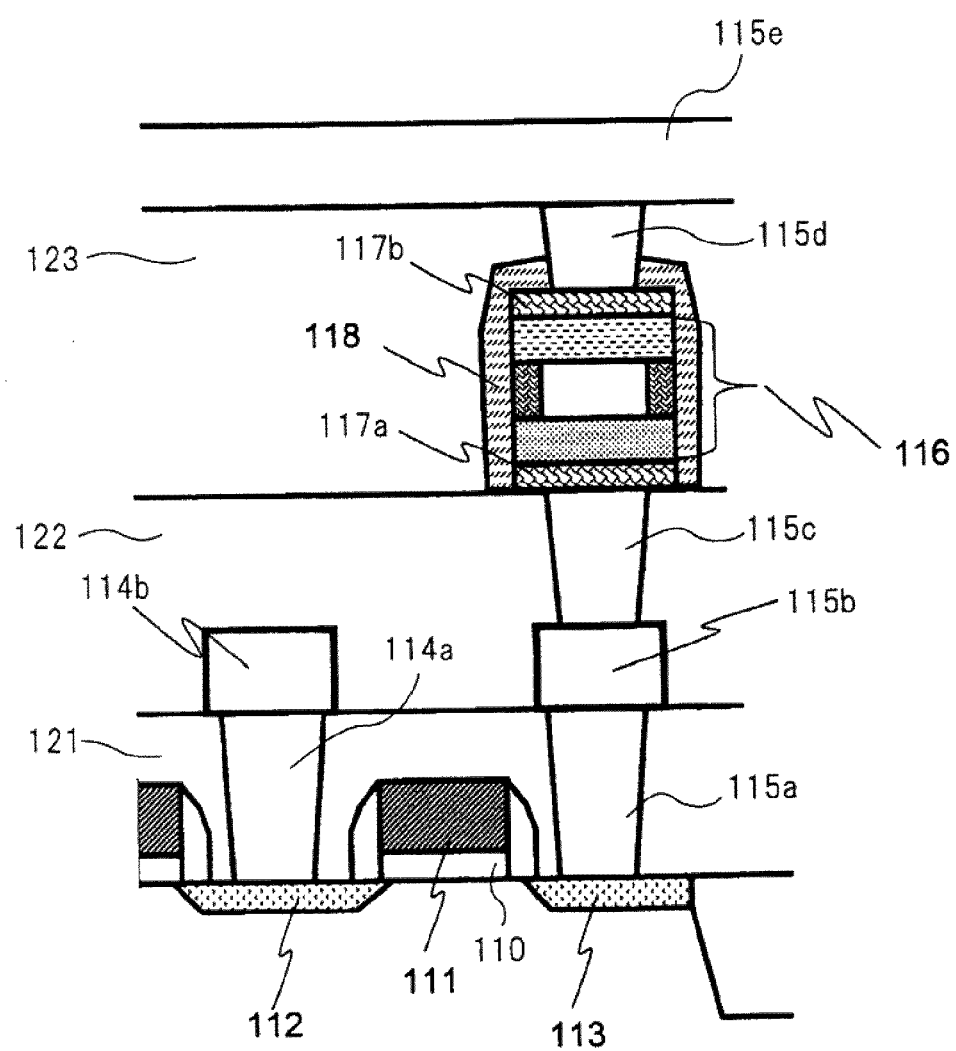
FIG. 17 is a schematic sectional view illustrating a semiconductor device in accordance with an exemplary embodiment of the present invention.

The above described variable resistance elements can be connected to a transistor provided on a silicon substrate, for example, as illustrated in FIG. 17.

In FIG. 17, a MOS field-effect transistor is formed, and the transistor includes gate insulating film 110 provided on a silicon substrate, gate electrode 111 provided thereon, and source region 112 and drain region 113 made of impurity introducing regions provided at both sides of the gate electrode. Further, first interlayer insulating film 121 is provided so as to cover the transistor, and wiring layer 114b and connection layer 115b are formed thereon, each of which is connected to source region 112 and drain region 113 via contact plugs 114a and 115a respectively.

On first interlayer insulating film 121, there is provided second interlayer insulating film 122 so as to cover wiring layer 114b and connection layer 115b, and variable resistance element 116 is provided thereon. The lower electrode of variable resistance element 116 is connected to via plug 115c through barrier layer 117a, and via plug 115c is connected to connection layer 115b.

On second interlayer insulating film 122, there is provided third interlayer insulating film 123 so as to cover variable resistance element 116, and wiring layer 115e is provided thereon. The upper electrode of variable resistance element 116 is connected to via plug 115d through barrier layer 117b, and via plug 115d is connected to wiring layer 115e. Around variable resistance element 116, there can be provided protection layer 118 to prevent an element material from diffusing into the interlayer insulating film and to prevent a contamination impurity from penetrating into the element.

According to the above configuration, variable resistance element 116 is formed on second interlayer insulating film 122 and is covered with third interlayer insulating film 123, but the configuration may be such that variable resistance element 116 is formed on first interlayer insulating film 121, and is covered with second interlayer insulating film 122. In this case, the lower electrode of variable resistance element 116 is connected to contact plug 115a through barrier layer 117a. Alternatively, the configuration may be such that variable resistance element 116 is formed on drain region 113, and is covered with first interlayer insulating film 121. In this case, the lower electrode of variable resistance element 116 is connected to drain region 113 through barrier layer 117a.

Hereinbefore, the present invention has been described with reference to exemplary embodiments, but the present invention is not limited to the above exemplary embodiments. Various modifications readily apparent to a person of ordinary skill in the art may be made in the configuration and the detail of the present invention within the scope of the present invention.

The invention claimed is:

1. A semiconductor memory device comprising a variable resistance element including a first electrode, a current path forming region provided in contact with the first electrode, and a second electrode provided in contact with the current path forming region,
   wherein the current path forming region comprises
      a first region made of a variable resistance material whose resistivity changes by applying voltage, the material containing a first metal element, and
      a second region formed by doping a second metal element to the variable resistance material such that a resistivity of the second region is higher than that of the first region and is not changed by applying a voltage used to change the resistivity of the first region;
   the first region is in contact with the first electrode and the second electrode, and extends from one electrode side to the other electrode side such that a current path is formed therebetween; and
   the second region is provided outside the first region in at least part of the current path forming region in direction extending from one electrode side to the other electrode side,
   wherein the variable resistance material is an oxide of Ni, and the first metal is Ni,
   and wherein the second region is made of an oxide of Ni containing Mn, and the second metal element is Mn.

2. The semiconductor memory device according to claim 1, wherein the semiconductor memory device comprises a
   laminated structure including the first electrode, the current path forming region, and the second electrode; and
   the second region is in contact with an periphery portion of at least one of the first electrode and the second electrode, and is provided on an outer circumference of the first region at least on the second region-contacting-electrode side.

3. The semiconductor memory device according to claim 2, wherein the second region is in contact with the periphery portion of the first electrode and the periphery portion of the second electrode, and is provided on the outer circumference of the first region over from one electrode side to the other electrode side.

4. The semiconductor memory device according to claim 1, wherein the variable resistance material is an oxide of the first metal element.

5. The semiconductor memory device according to claim 4, wherein the variable resistance material is an oxide of at least one kind of metal element selected from the group consisting of Ni, Ti, Zr, Hf, Fe, V, Mn, and Co.

6. The semiconductor memory device according to claim 1, wherein the second metal element is at least one kind of metal element selected from the group consisting of Mn, Fe, Ta, Al, Si, Ge, Ti and Nb.

7. The semiconductor memory device according to claim 1, wherein the variable resistance material is an oxide of Ni, and the second metal element is Mn.

8. The semiconductor memory device according to claim 1, further comprising a transistor electrically connected to the variable resistance element.

9. The semiconductor memory device according to claim 8, wherein the transistor includes a source region, a drain region, a gate insulating film, and a gate electrode; and one electrode of the variable resistance element is electrically connected to the source region or the drain region.

10. The semiconductor memory device according to claim 9, wherein one electrode of the variable resistance element is electrically connected to the source region or the drain region via a barrier layer.

11. The semiconductor memory device according to claim 1,
    wherein the variable resistance element is provided above the transistor via an interlayer insulating film; and
    one electrode of the variable resistance element is connected to a conductive material extracted from the source region or the drain region through the interlayer insulating film.

12. The semiconductor memory device according to claim 1, wherein the first region is sandwiched between the second regions in at least part of the current path forming region in direction extending from one electrode side to the other electrode side.

13. The semiconductor memory device according to claim 1, wherein the first region is surrounded by the second region in at least part of the current path forming region in direction extending from one electrode side to the other electrode side.

14. The semiconductor memory device according to claim 1, wherein the second region is in contact with at least one of the first electrode and the second electrode; and the first region is surrounded by the second region at least on the second region-contacting-electrode side.

15. A method of manufacturing a semiconductor memory device, the semiconductor memo device comprising a variable resistance element including a first electrode, a current path forming region provided in contact with the first electrode, and a second electrode provided in contact with the current path forming region,
    wherein the current path forming region comprises
       a first region made of a variable resistance material whose resistivity changes by applying voltage, the material containing a first metal element, and
       a second region formed by doping a second metal element to the variable resistance material such that a resistivity of the second region is higher than that of the first region and is not changed by applying a voltage used to change the resistivity of the first region;
    the first region is in contact with the first electrode and the second electrode, and extends from one electrode side to the other electrode side such that a current path is formed therebetween; and
    the second region is provided outside the first region in at least part of the current path forming region in direction extending from one electrode side to the other electrode side,
    wherein the semiconductor memory device comprises a laminated structure including the first electrode, the current path forming region, and the second electrode; and
    the second region is in contact with an periphery portion of at least one of the first electrode and the second electrode, and is provided on an outer circumference of the first region at least on the second region-contacting-electrode side, the method comprising:
    forming a first electrode;
    forming a variable resistance material layer including a first metal element on the first electrode;
    forming a mask on the variable resistance material layer;
    forming a second metal containing layer including a second metal element on the entire surface so as to cover the mask;

conducting heat treatment such that the second metal element is doped and diffused from the second metal containing layer to the variable resistance material layer to form a first region without the second metal element being doped and a second region with the second metal element being doped;

removing the mask; and forming a second electrode so as to cover a portion where the first region is exposed by removing the mask.

16. A method of manufacturing a semiconductor memory device, the semiconductor memo device comprising a variable resistance element including a first electrode, a current path forming region provided in contact with the first electrode, and a second electrode provided in contact with the current path forming region, wherein the current path forming region comprises a first region made of a variable resistance material whose resistivity changes by applying voltage, the material containing a first metal element, and a second region formed by doping a second metal element to the variable resistance material such that a resistivity of the second region is higher than that of the first region and is not changed by applying a voltage used to change the resistivity of the first region;

the first region is in contact with the first electrode and the second electrode, and extends from one electrode side to the other electrode side such that a current path is formed therebetween; and the second region is provided outside the first region in at least part of the current path forming region in direction extending from one electrode side to the other electrode side, wherein the semiconductor memory device comprises a laminated structure including the first electrode, the current path forming region, and the second electrode;

the second region is in contact with an periphery portion of at least one of the first electrode and the second electrode, and is provided on an outer circumference of the first region at least on the second region-contacting-electrode side; and the second region is in contact with the periphery portion of the first electrode and the periphery portion of the second electrode, and is provided on the outer circumference of the first region over from one electrode side to the other electrode side, the method comprising:

forming a first electrode material layer;

forming a variable resistance material layer including a first metal element on the first electrode material layer;

forming a second electrode material layer on the variable resistance material layer;

patterning the first electrode material layer, the variable resistance material layer and the second electrode material layer to form a laminated structure including a first electrode, a variable resistance material layer and a second electrode;

forming a second metal containing layer including a second metal element on the entire surface so as to cover the laminated structure; and conducting heat treatment such that the second metal element is doped and diffused from the second metal containing layer to the variable resistance material layer to form a first region without the second metal element being doped and a second region with the second metal element being doped.

* * * * *